United States Patent [19]

Wang et al.

[11] Patent Number: 4,509,146

[45] Date of Patent: Apr. 2, 1985

[54] HIGH DENSITY JOSEPHSON JUNCTION MEMORY CIRCUIT

[75] Inventors: Tsing-Chow Wang, Norristown; Richard M. Josephs, Willow Grove, both of Pa.

[73] Assignee: Sperry Corporation, New York, N.Y.

[21] Appl. No.: 446,129

[22] Filed: Dec. 2, 1982

[51] Int. Cl.³ .............................................. G11C 11/44
[52] U.S. Cl. ................................... 365/162; 307/306; 365/160
[58] Field of Search ..................... 365/162, 160, 161; 307/306

[56] References Cited

U.S. PATENT DOCUMENTS 4,130,893 12/1978 Henkels .............................. 365/162

Primary Examiner—Terrell W. Fears
Attorney, Agent, or Firm—John B. Sowell; Thomas J. Scott; Marshall M. Truex

[57] ABSTRACT

A superconductive Josephson junction high density memory array is provided. Each memory cell in the array comprises a two branch superconducting interferometer storage loop which has only a single Josephson junction device in one of the branches. The Josephson junction devices are mounted on a substrate having a patterned ground plane. The ground plane pattern is provided with holes or apertures which surround the Josephson junction devices so that the control current of the control lines couple with the tunnel junctions of the Josephson junction devices but not with the ground plane. This structural arrangement provides a threshold characteristic for the single Josephson junction device which is symmetrical to the gate current, thus, may be easily switched to two current states indicative of two logic states.

14 Claims, 9 Drawing Figures

HIGH DENSITY JOSEPHSON JUNCTION MEMORY CIRCUIT

BACKGROUND OF THE INVENTION

1. Field of the Invention

This invention relates to superconductive Josephson junction memory circuits. More particularly, the invention relates to a high density and high performance Josephson junction memory cell for memory arrays or cache memories.

2. Description of the Prior Art

This invention is an improvement of prior art Josephson junction memory cells and memory circuits. One of the first Josephson junction memory cells described in the literature is entitled "A Subnanosecond Josephson Tunneling Memory Cell With Non-Destructive Readout" by Hans H. Zappe published in the IEEE's Journal of Solid-State Circuits, Vol. SC-10, No. 1, February 1975 at pages 12 to 19. This early memory circuit teaches a single memory cell which employs a minimum of two Josephson junction devices in a superconductive interferometer storage loop. The current in the storage loop can be made to circulate either clockwise or counterclockwise to represent either a logic one or logic zero state. A single control line is employed to couple positive or negative signals to the storage loop and to switch one of the two Josephson junction devices into a high voltage state, thus, selecting the direction of flow of the circulating current in the storage loop. This circuit employs asymmetrical threshold characteristic curves for both of the Josephson junction devices with respect to the control current to provide proper selection of the direction of circulating current of the storage loop. This circuit requires that the memory be initialized employing stronger current than the write pulses.

An array memory is described in "Basic Design of a Josephson Technology Cache Memory" by S. M. Faris, et al published in the IBM Journal of Research and Development, Vol. 24, No. 2, March 1980 at pages 143 to 154. This article recognized the problems associated with the aforementioned Zappe memory cell. The article teaches a three Josephson junction superconducting interferometer in one of the branches of a storage loop. The purpose of employing the three Josephson junctions in the interferometer storage loop was to provide a symmetrical threshold characteristic curve which in turn enhances the operating margin of the three Josephson junction devices and dispenses with the requirement of directional control currents for selecting a logical state represented by circulating current in the storage loop. In the S. M. Faris, et al storage cell, a logic one is represented by a circulating current in the storage loop and a logic zero is represented by no circulating current in the storage loop.

While the S. M. Faris, et al article teaches how to eliminate some of the problems associated with the earlier storage cells, this improvement was achieved by employing a larger number of Josephson junction devices in the storage loop, thus, employing more area on an integrated circuit chip to achieve the improvement.

It would be desirable to provide a new and novel Josephson junction memory circuit which would combine all of the features of the prior art memory cells and storage loops and yet employ fewer Josephson junction devices so that higher density integrated circuits could be made. Not only would the density of the storage loops be improved, but the employment of fewer Josephson junction devices for each memory cell increase the yields of useable devices.

SUMMARY OF THE INVENTION

It is a principal object of the present invention to provide a novel Josephson junction memory cell.

It is yet another principal object of the present invention to provide a novel Josephson junction memory circuit having a plurality of selectable memory cells.

It is yet another object of the present invention to provide a Josephson junction memory cell storage loop having only a single Josephson junction device.

It is yet another object of the present invention to provide a Josephson junction memory cell storage loop having a single Josephson junction device and having a threshold characteristic curve which is symmetrical to the gate current of the Josephson junction device.

It is a general object of the present invention to provide a simplified and improved Josephson junction memory cell circuit which can be easily implemented as an integrated circuit having thousands of memory cells on a single integrated circuit chip.

According to these and other objects of the present invention, there is provided a memory cell comprising a superconducting interferometer storage loop which has only a single Josephson junction device in one of the branches of the storage loop. The single Josephson junction device is mounted on a substrate having a novel ground plane pattern. The ground plane pattern is provided with holes or apertures at the point where the Josephson junction device is mounted on the substrate so that the control current in the control lines couples with the tunnel junction of the Josephson junction device but does not couple with the ground plane. This novel structural arrangement provides a threshold characteristic for the single Josephson junction·device which is symmetrical to the gate current.

DESCRIPTION OF THE PREFERRED EMBODIMENT

Figure 1:
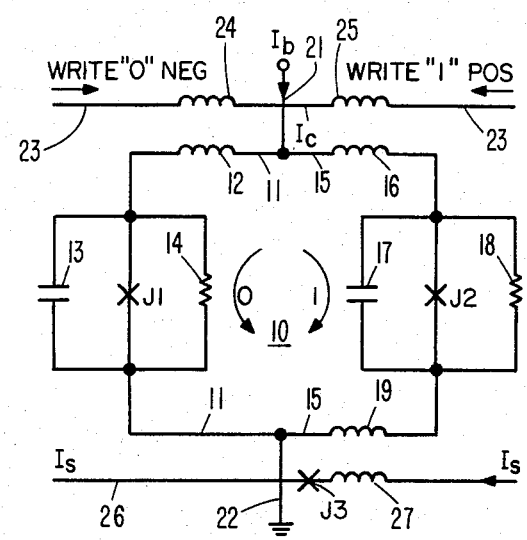
FIG. 1 is a logic circuit diagram of the earliest type prior art Josephson junction memory cell storage loop.

Refer now to FIG. 1 showing a prior art type Josephson junction memory cell storage loop. The storage loop 10 comprises a balanced junction interferometer storage loop. The left branch 11 of the storage loop 10 includes a left branch inductance 12 and a Josephson junction device J1 which has an equivalent circuit component of capacitance 13 and resistance 14. The right branch 15 of the storage loop 10 comprises a right branch inductance 16 and a Josephson junction device J2 having an equivalent circuit component capacitance 17 and resistance 18. The right branch 15 of the storage loop 10 further includes a right branch inductive coupling 19 for sensing. The storage loop 10 is supplied with a bias current source line 21 and a reference voltage source 22. In order to use the storage loop 10 as a memory cell, there is further provided a write line 23 which includes in series therewith write line coupling inductances 24 and 25. As will be explained in detail hereinafter, the procedure for writing a logic one and a logic zero requires the application of a different polarity pulse to the write line 23. In order to read or determine the logic information stored in the storage loop 10 there is provided a sense line 26 and a Josephson junction device J3 having a sense line coupling inductance 27 in series therewith.

Figure 2:
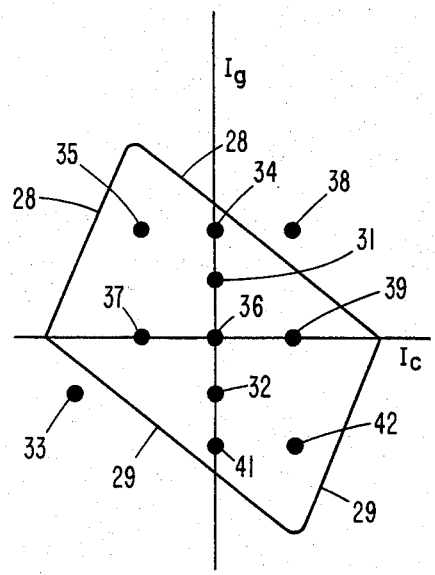
FIG. 2 is a threshold characteristic curve for the Josephson junction devices of the circuit of FIG. 1.

Refer now to FIG. 2 showing the threshold characteristic curve for the circuit of FIG. 1 and to the details of FIG. 1. Assume that the circuit of FIG. 1 is first being placed into operation and there is no circulating current in either side of the loop 10. It is necessary to initialize the storage loop 10 before proper writing of information therein. The vertical axis of FIG. 2 represents the current flowing in the Josephson junctions J1 and J2. The upper curve 28 is associated with the right branch and junction J2 and the lower curve 29 is associated with the left branch and Josephson junction J1.

To initialize the storage loop 10, it is necessary to apply a biasing current $I_b$ or word current on line 21. The biasing current $I_b$ on line 21 is split evenly between the left branch 11 and the right branch 15 causing the operating points of the characteristic curves to shift to points 31 and 32. To write a one into the storage loop 10 and to initialize the storage loop, a positive current is applied to the write line 23 which causes the left branch biasing point 32 to be shifted across the threshold line 29 to the point 33 representative of the high voltage state of the Josephson junction device J1. When the Josephson junction J1 shifts to the operating point 33, it also switches to the high voltage state and immediately steers or diverts all of the biasing current on line 21 through the right branch 15 causing the right branch characteristic curve to be shifted from the operating point 31 to its new operating point 34. This causes the current in the left branch 11 and junction J1 to drop to zero which immediately shifts the Josephson junction device back to its superconducting state. When Josephson junction J1 shifts into its superconducting state, the current flowing clockwise in the right branch 15 now continues in its path clockwise and circulates in the reverse direction clockwise through Josephson junction J1. The write current on write line 23 is first removed and then the biasing current on line 21 is removed so that the current flowing clockwise in the storage loop 10 drops back to operating point 31 and continues to circulate clockwise as long as there is no disturbance of the storage loop. As long as the Josephson junction superconducting storage loop 10 is maintained at its preferred cryogenic temperature, there is no damping or attenuation and the current continues to circulate providing a permanent memory. It will be noted that the magnitude of the current flowing in storage loop 10 is one half the initial biasing current applied to the bias current source on line 21.

It will be noted that the preferred initialization of the storage loop 10 is to place the storage loop in the clockwise circulating current condition which is representative of a one stored in the storage loop. If a one is now written into the storage loop after it is initialized, a positive write current is applied to the write line 23. The magnitude of the write current being applied to the write line 23 is only half the write current applied to the write line 23 for purposes of initialization. When the biasing current $I_b$ on line 21 is first applied, the operating point for the right branch 15 moves from point 31 to point 34. The operating point 31 of the left branch then moves from point 31 to zero. When the positive write current is applied to the write line 23, operating point 34 is moved to point 35 which is still inside the right branch threshold curve 28. The zero operating point 36 of the left branch moves from point 36 to point 37. Thus, it is shown that neither junction is switched by the writing of a one into the storage loop which is initialized into the logic one state. When the positive write current is removed, the operating point 35 of the right branch moves to operating point 34 and the operating point 37 of the left branch moves to operating point 36 at zero. When the biasing current on line 21 is subsequently removed, the right branch operating point 34 moves to operating point 31 which is representative of a positive clockwise circulating current in the right branch 15 and a negative clockwise current flow in the left branch 11. The operating point of J1 thus moves to negative operating point 31.

In order to write a zero into the storage loop 10 which contains a logic one, it is first necessary to apply a biasing current on line 21 which divides between the branches 11 and 15. The operating point 31 for the right branch moves to operating point 34 and the operating point 31 for the left branch, representative of a negative flow in Josephson junction J1, moves from operating point 31 to operating point 36 or zero. Now when the negative write current is applied to write line 23 to write a zero in the storage loop, the operating point 34 of the right branch 15 of the storage loop 10 moves from operating point 34 to operating point 38, crossing the threshold 28 and causing the Josephson junction J2 to switch into the high voltage state. When the Josephson junction J2 switches into the high voltage state it diverts all of the biasing current in line 21 through the Josephson junction J1 and the left branch 11 in the counterclockwise direction shifting the operating point 36 of the left branch to the new operating point 42. The right branch 15 shifts its operating point 31 to the new operating point 38 in the high voltage state, the current in the right branch 15 drops to zero and the right branch 15 shifts its operating point 38 to point 39. When the write current on line 23 is removed, the operating point 39 for the right branch shifts from operating point 39 to the zero point 36 and the left branch operating point 42 shifts to operating point 41. When the biasing current on line 21 is now removed, the operating point 41 of the left branch shifts to its new operating point 32 and the operating point 36 of the right branch shifts to its new operating point 32 because of the negative or counterclockwise flow through Josephson junction J2.

Having explained the operation of the prior art memory cell, it will now be recognized that the storage loop 10 requires initialization before writing logic information into the storage loop 10 and that the write current necessary to initialize the storage loop 10 is a different magnitude from that employed for writing logic information into the storage loop 10. The logic information representing a logic one is represented by a clockwise flow of current in the storage loop 10 and the logic information representative of a logic zero is represented by a counterclockwise circulation of current in the storage loop 10.

There is provided for non-destructive readout of the information in storage loop 10 a sense line 27 which includes in series therewith a Josephson junction device J3 and a sense line coupling inductance 27. When the current is flowing clockwise in the right branch 15 of loop 10, the current coupled into the sense line 26 augments the sense line current sufficiently to cause the Josephson junction device J3 to switch into its high voltage state. When the circulating current in storage loop 10 is circulating counterclockwise through the left branch 11 and the right branch inductive coupling 19, it subtracts from the current flowing in the sense line 26, thus preventing the Josephson junction device J3 from switching. The voltage on sense line 26 may be sensed to determine whether the Josephson junction device J3 has switched or maintained its superconductive state indicative of the one and zero logic states. When the sense current is removed from the sense line 26, the Josephson junction device J3 returns to its superconducting state and the circulating current in the storage loop 10 maintains its original direction of flow thus providing a non-destructive readout of the information stored in the storage loop.

Figure 3:
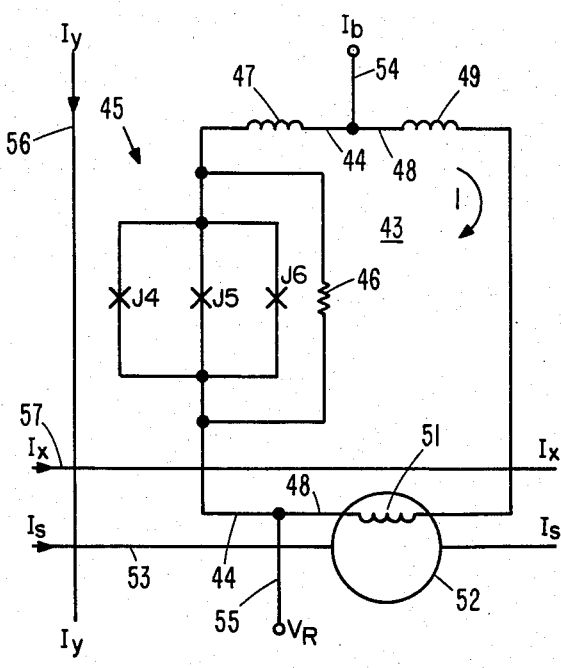
FIG. 3 is a logic circuit diagram of an improved prior art type Josephson junction memory cell storage loop.

Refer now to FIG. 3 showing a logic current diagram of an improved prior art Josephson junction memory cell storage loop. The storage loop 43 comprises a left branch 44 having a three Josephson junction superconducting interferometer which comprises three Josephson junction devices J4, J5 and J6. The critical current of the device J5 is designed to be twice the value of the critical current of the Josephson junction devices J4 and J6. As explained in the S. M. Faris article mentioned hereinbefore, the provision of the three Junction interferometer overcomes some of the difficulties with the storage loop described hereinbefore with regards to FIG. 1 and improves the operational margin as well as providing a symmetrical threshold curve for operation of the storage loop. One improvement of the FIG. 3 storage loop over the FIG. 1 storage loop is that no initialization is required for the FIG. 3 storage loop and the direction of current flowing in the control lines does not have to be changed. Further, the logic one state for the storage loop is represented by the circulating current flowing clockwise in the storage loop 43 and the logic zero is represented by a condition having no circulating current. A damping resistor 46 is shown in parallel with the three junction interferometer 45 and provides means for damping the current to zero when a logic zero is written into the storage loop 43. The resistor 46 provides a critical condition such that the three junction interferometer 45 will reset back to the zero voltage state when the control and biasing currents are removed. The left branch 44 also includes a left branch inductance 47. The right branch 48 of storage loop 43 includes a right branch inductance 49 and a coupling inductance 51. The coupling inductance 51 is inductively coupled to the sense gate 52 which is in sense line 53. A biasing current $I_b$ on line 54 and low voltage reference source on line 55 are connected to the storage loop 43. Instead of having a single write line, there is provided a column write line 56 and a row write line 57. The write current for the column is shown as $I_y$ and the write current for the row is shown as $I_x$.

Figure 4:
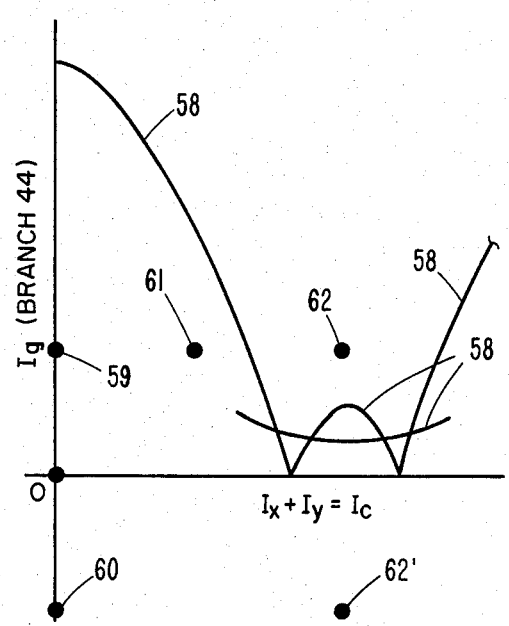
FIG. 4 is a threshold characteristic curve for the Josephson junction devices of the circuit of FIG. 3.

Refer now to FIG. 4 showing the threshold characteristic for the interferometer 45. Also refer to the details of FIG. 3. Assume that the storage loop 43 has not been used and there is no circulating current therein. When it is desired to write a one into the storage loop 43, no initialization is required. When the biasing current $I_b$ is applied to the line 54, it splits at the two branches 44 and 48. The composite threshold curve 58 is representative of the combined Josephson junctions J4, J5 and J6. The vertical axis of the threshold curve is representative of the gate current flowing in the left branch line 44. Thus, the application of half of the biasing current through the left branch 44 causes the zero operation point to move from the zero point to point 59. When the control current $I_x$ or $I_y$ is applied to one of the write lines 56 or 57, the operating point moves from the point 59 to the point 61. However, when control currents $I_x$ and $I_y$ are applied to both control lines 56 and 57, the operating point moves from point 59 to point 62. Operating point 62 is outside the composite threshold characteristic curve 58, thus, the interferometer 45 and its Josephson junctions J4, J5 and J6 switch to the high voltage condition. When the interferometer 45 switches to the high voltage condition, the current $I_b/2$ flowing in the left branch 44 is diverted into the right branch. The control currents $I_x$ and $I_y$ and then the biasing current $I_b$ is removed. When the external currents are removed, the clockwise current flowing in the storage loop 43 drops to $I_b/2$ due to the fact that there are now two inductive reactances 47 and 49 in the clockwise current path of the storage loop 43, and the interferometer 45 has switched back to a negative superconducting state operating point 60. The clockwise circulating current in the storage loop 43 passing through the interferometer 45 and the right branch 48 does not pass through the damping resistor 46 when the storage loop 43 is in the logic one state.

Assume that a logic one is stored in the storage loop 43 when it is desired to change the logic state of the storage loop to a logic zero. The $I_b/2$ current flowing in the storage loop 43 is flowing through the interferometer 45 in the negative or clockwise direction and is at operating point 60. Thus, when the combined control currents on control lines 56 and 57 are applied in the absence of the biasing current, they are sufficient to change the negative operating point 60 which is inside of the threshold curve to a point 62′ outside of the threshold curve for the interferometer 45. Since the interferometer 45 has a symmetrical threshold characteristic with respect to the gate current, the new operating point is analogous to the positive operating point 62. Therefore, the interferometer 45 will switch to the high voltage state and the clockwise circulating current in the storage loop 43 will now decay to zero through the damping resistor 46 representative of a logic zero state, leaving the interferometer at the zero threshold point.

When sense current is applied to sense line 53, it is passed through the two Josephson junction unbalanced superconducting interferometer 52. When the circulating current in the storage loop 43 is in the clockwise or circulating direction, it augments the current flow in the sense line 53 sufficient to cause the two Josephson junction interferometer 52 to switch to the high voltage state. If there is no circulating current in the storage loop 43, the application of the sensing current to the sense line 53 is insufficient to switch the sense gate 52 to the high voltage state. The switching condition of the interferometer 52 may be sensed by a voltage sensing line to determine the state of the storage loop without destructive readout.

Figure 5:
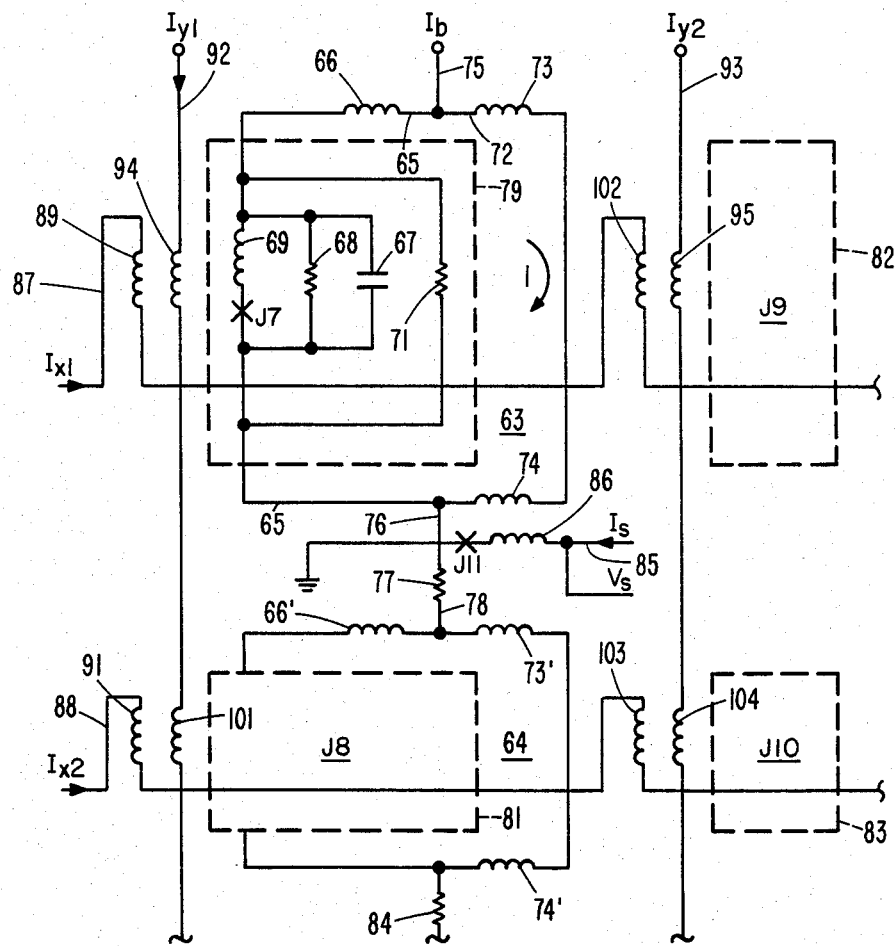
FIG. 5 is a logic circuit diagram of the present invention Josephson junction memory cell storage loops.

Refer now to FIG. 5 which is a logic circuit diagram of the present invention memory cell array. For purposes of illustration of this invention, only two of the storage loops 63 and 64 are shown. The storage loop 63 has a first or left branch 65 which includes an inductive reactance 66 and a single Josephson junction device J7. The Josephson junction device J7 has an equivalent circuit component of capacitance 67 and resistance 68 in parallel with the device J7. The Josephson junction device J7 has an equivalent circuit component of inductance 69 in series with the Josephson junction device J7. A damping resistor 71 is applied in parallel across the Josephson junction device J7. The right branch 72 of the storage loop 63 includes an inductive reactance 73, equal in magnitude to inductive reactance 66, and a coupling inductance 74. The damping resistance $R_d$ is preferably equal to $V_{LC}/1.6C$, where C is the equivalent parallel capacitance of the device and L is the inductive reactance of the storage loop. The biasing current line 75 is connected to the biasing current source $I_b$ and the storage loop 63 is further connected to a reference voltage source line 76. In the present invention, the reference voltage source 76 is further connected to an isolation resistor 77 which is connected to the biasing current line 78 of the next storage loop 64 shown in a column of two storage loops. The Josephson junction device J7 and its damping resistor 71 are shown inside of phantom lines 79. The structure shown inside of phantom line 79 is repeated at the storage loop 64 inside of phantom lines 81. Further, the phantom lines 82 and 83 are employed to illustrate that an identical structure having single Josephson junction devices J8, J9 and J10 therein are included within the phantom line blocks. It will be understood that the purpose of illustrating the phantom line blocks is to illustrate a plurality of storage loops in column arrangement and a plurality of storage loops in row arrangement. The biasing current applied to biasing current line 75 will be conducted through the plurality of storage cells the same column. The voltage reference line of one storage loop will be separated from the biasing current source by an isolation resistor such as that shown at 84. Each of the storage loops will be provided with its own branch matched inductive reactances 66' and 73' as well as its own coupling inductance 74'.

A single Josephson junction device like J11 is provided in each of the sense lines which is shown having its own equivalent circuit component of inductance 86 in series therewith. The Ix row control lines 87 and 88 are shown having in series therewith a control line coupling inductance 89 and 91. The Iy column control lines 92 and 93 are shown having control line coupling inductances 94 and 95. It will be understood that the control line coupling inductances are inductively coupled to the inductance like 69 of the Josephson junction device located adjacent thereto. In the preferred embodiment operation of the present invention, only one Y control line 92 or 93 and only one X control line 87 or 88 is selected at any one time in order to select a single memory cell or storage loop like 63 or 64 in the memory array.

Figure 6:
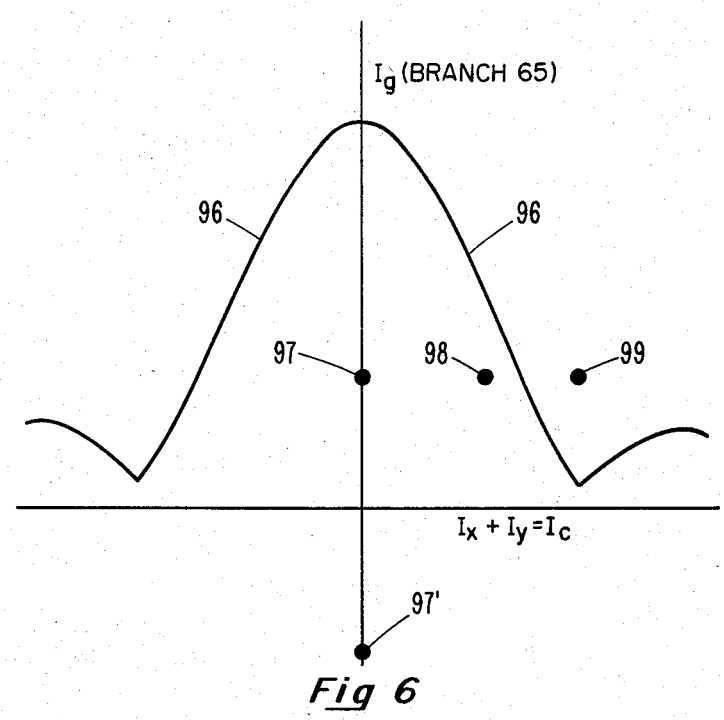
FIG. 6 is a threshold characteristic curve for the Josephson junction devices of the memory cell circuits of FIG. 5.

Refer now to both FIGS. 5 and 6 for the operation of the present invention. Assume that the storage cells of the memory array are just being placed in operation and no circulating current is flowing in any of the memory cells. Assume further that a logic one is desired to be stored in memory storage loop 63. The threshold characteristic for the single Josephson junction J7 is shown as curve 96 of FIG. 6. When the biasing current $I_b$ is applied to the biasing current line 75, the current splits equally into the first and second branches 65 and 72 of storage loop 63. In similar manner, all of the storage loops in the column below storage loop 63 are half selected and have biasing currents flowing through their storage loops. When the write control current is applied to both the X control line 87 and the Y control line 92, the control line coupling inductances 89 and 94 both couple to the inductive element of the Josephson junction device J7. No other memory cell in the memory array has two control line coupling inductances coupled to a single Josephson junction device. Application of the biasing current $I_b$ to the line 75 causes the operating point of the Josephson junction device J7 to move from its zero point to its operating point 97. Application of the control current on $I_x$ causes the operating point to move to the operating point 98 and application of the control current $I_y$ on control line 92 causes the operating point to move further to the operating point 99 outside of the threshold curve 96. The current flowing through the Josephson junction device J7 is then sufficient to cause it to switch to the high voltage state which results in diverting the biasing current in line 75 completely to the second or right branch 72 and start the circulating current flowing through the right branch 72. The Josephson junction device J7 automatically switches back to its zero state when the control current on the control lines 87 and 92 is first removed. The subsequent removal of the biasing current on line 75 leaves the devices at operating point 97'. This results in a circulating current having a magnitude of $I_b/2$ circulating in the storage loop 63 in a clockwise direction.

When it is desired to write a logic zero in a storage loop 63 when it contains a logic one therein, no biasing current is applied to the storage loop 63 and the control current is supplied to the control lines 87 and 92 to select the storage loop 63. The operation of the storage loop 63 is the same as was explained hereinbefore with regards to FIG. 5. The application of the control currents $I_x$ and $I_y$ to the control lines 87 and 92 causes the Josephson junction device J7 to switch to its high voltage state which causes the clockwise circulating current to be damped to zero by the damping resistor 71. When the control currents are removed from the control lines 87 and 92, a logic zero or no circulating current will be stored in the storage loop 63. The application of a control current on control line 88 and 92 will energize the inductive reactances 91 and 101 to select the storage loop 64. In similar manner, the simultaneous application of a control current on control lines 87 and 93 will activate the inductive reactances 102 and 95 to select the memory cell represented by the Josephson junction device J9 in block 82. Similarly the simultaneous application of a control current on lines 88 and 93 will activate the inductive reactances 103 and 104 to select the storage loop represented by the Josephson junction device J10 in block 83.

Figure 7:
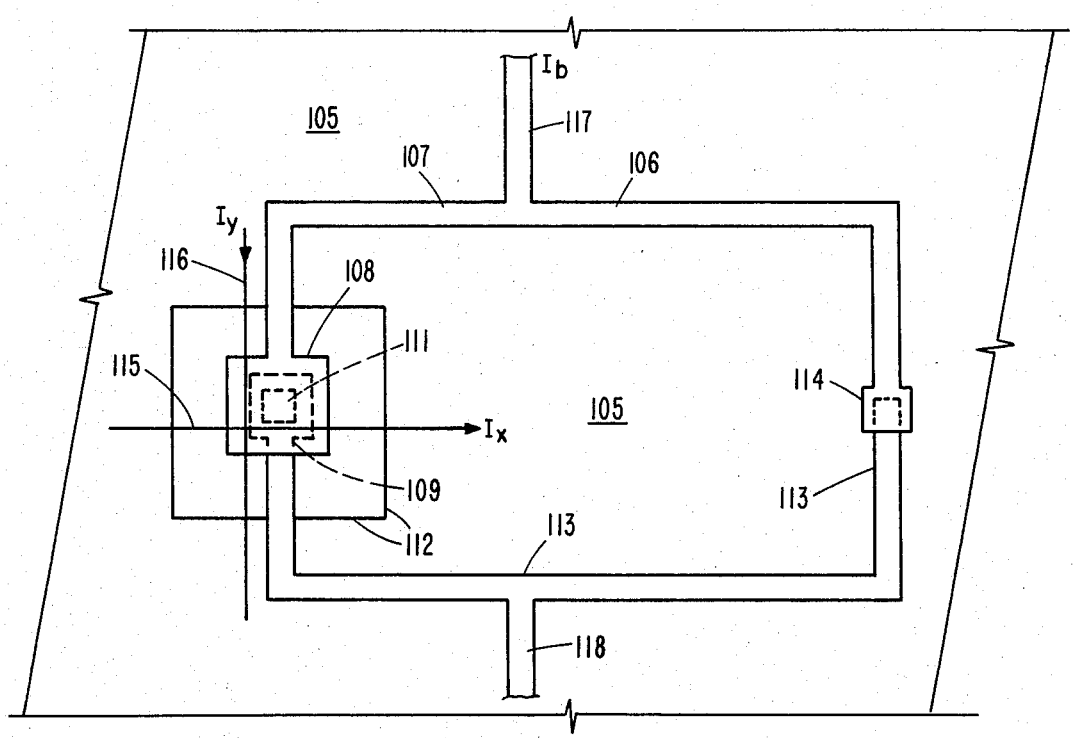
FIG. 7 is a schematic drawing showing the layout of a Josephson junction memory cell of the memory circuit of FIG. 5.

FIG. 7 is a schematic diagram showing how an individual Josephson junction device may be constructed so that the coupling between the control lines and the tunnel barrier of the Josephson junction device may be isolated from the ground plane. The superconductive ground plane pattern 105 is provided with an insulating layer and deposited thereon is a right branch line 106 and a left branch line 107. The left branch line 107 is connected to the counterelectrode 108 which is located on top of the base electrode 109. A tunneling barrier junction 111 is shown in phantom lines which is in between the base electrode 109 and the counterelectrode 108. The base electrode 109 is located in a hole or aperture 112 in the superconductive ground plane 105. The base electrode conductive line 113 is connected to the counterelectrode conductive line 106 at the junction point 114. The X control line 115 and the Y control line 116 are shown diagramatically for purposes of illustration. The biasing current $I_b$ is applied to the biasing current line 117 and the voltage reference source is connected to the voltage reference line 118.

Figure 8:
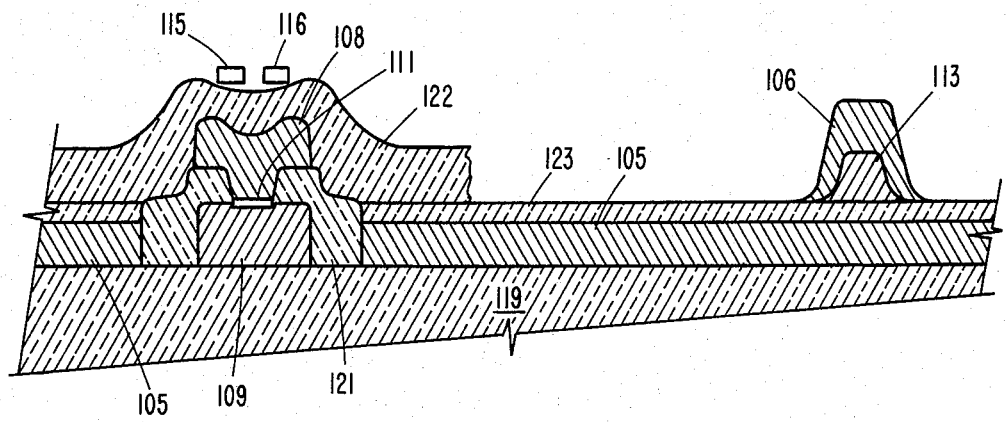
FIG. 8 is a schematic cross-section diagram in elevation of the memory cell shown in FIG. 7.

Refer now to FIG. 8 which is a schematic cross-section of the storage loop shown in FIG. 7. The base electrode 109 is shown located on the insulative substrate 119 and is isolated from the ground plane 105 by dielectric insulation 121. The tunnel barrier junction 111 is formed on the base electrode 109 and the counterelectrode 108 is formed thereon. The upper insulation layer 122 isolates the X and Y control lines 115 and 116 from the counterelectrode 108 and the base electrode 109. A lower isolation layer 123 is provided on top of the ground plane 105 to provide insulation between the conductive lines 106, 107 and 113 which are connected to the counterelectrode and the base electrode respectively. It will be understood that the conductive line 113 which is shown on top of the lower isolation layer 123 is connected to the base electrode 109 in the hole or aperture 112 by photoresist patterning and that the left branch conductive line 107 is connected to the counterelectrode 108 by photoresist patterning. Since the Josephson junction device comprising the base electrode 109, the counterelectrode 108 and the tunnel barrier junction 111 are completely separated and apart from the ground plane 105, there can be no inductive coupling of the currents which are flowing in the control lines 115 and 116 through the ground plane to effect the junction 111.

Figure 9:
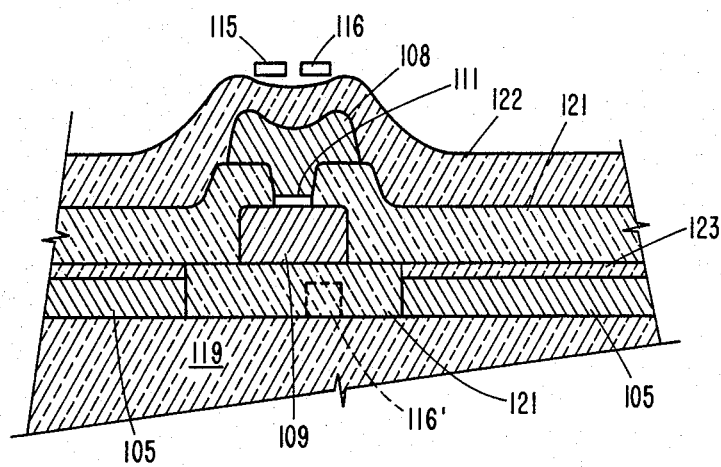
FIG. 9 is a schematic cross-sectional elevation of a modified form of a Josephson junction device similar to the Josephson junction device shown in FIG. 8.

Refer now to FIG. 9 which is a modified embodiment of the Josephson junction device shown in FIG. 8. The hole or aperture 112 is completely filled with dielectric insulation 121 before the base electrode 109 is deposited thereon. After the base electrode 109 is deposited on the dielectric insulating pad 121 in the aperture or hole 112, the Josephson junction device is completed thereon. A Y control line 116' is shown in phantom lines in the dielectric insulation pad 121. This control line may be deposited at the same time the ground plane 105 is deposited on the substrate 119 to provide a Y control line below the Josephson junction device. It will be understood that the control 116' is completely isolated from the ground plane 105 in this modified embodiment.

Having explained a preferred embodiment and a modified embodiment of a Josephson junction device which is completely isolated from the ground plane, it will now be understood that a single Josephson junction device may be included into a memory cell so that the threshold characteristic curve shown in FIG. 6 is symmetrical to the gating current in the Josephson junction device. Therefore, it is possible to construct a complete memory cell employing only one Josephson junction device in the storage loop and a second Josephson junction device in the sensing line. This novel structure completely simplifies the structure required for manufacturing memory cells employing Josephson junction devices and results in higher density integrated circuit devices and higher yields of the memory cells on integrated circuit devices.

A preferred embodiment of a Josephson junction device which is isolated from a ground plane has been illustrated as well as a practical modified embodiment. Other structures and embodiments such as dual patterned ground planes and top layer ground planes are operable, but not as practical to construct will now be apparent to those skilled in the art of constructing semiconducting and superconducting devices.

We claim:

1. A high density Josephson junction memory circuit comprising:
   a substrate,
   a ground plane pattern on said substrate,
   a plurality of memory cells on said substrate,
   each memory cell comprising a storage loop having a biasing gate current source, a low reference voltage source and a storage loop connected between said current source and said voltage source,
   said storage loop having a first branch and a second branch connected in parallel,
   a single Josephson junction device in said first branch,
   said Josephson junction device being mounted on the substrate adjacent and apart from said ground plane pattern,
   an X current control line inductively coupled to said Josephson junction device,
   a Y current control line inductively coupled to said Josephson junction device,
   said coupling between said X and Y current control lines and said Josephson junction device being separated from said ground plane pattern so that the threshold characteristic of said Josephson junction device is symmetrical with respect to said biasing gate current, and
   sensing means inductively coupled to said second branch of said storage loop for sensing the magnitude of the current flowing in said loop of said memory cell.

2. A high density Josephson junction memory circuit as set forth in claim 1 wherein said biasing gate current is applied to said storage loop during a sensing operation,
   said sensing means further comprising a sensing current applied to said sensing means during a sensing operation,
   said sensing means further comprising a Josephson junction device inductively coupled to said second branch of said storage loop for sensing the magnitude of the current flowing in said loop of said memory cell.

3. A high density Josephson junction memory circuit as set forth in claim 2 wherein said Josephson junction device in said sensing loop is biased to switch into the high voltage state by said sensing current, when said storage loop has a storage circulating current therein.

4. A high density Josephson junction memory circuit as set forth in claim 1 wherein control currents are applied to said X and Y control current lines simultaneously with said biasing gate current of sufficient magnitude to switch said Josephson junction in said first branch of said storage loop into a high voltage state, and the removal of said currents will reset said Josephson junction device to a superconducting state with a circulating current in said storage loop.

5. A high density Josephson junction memory circuit as set forth in claim 1 wherein current is applied to said X and said Y current control lines simultaneously with the absence of said biasing gate current of sufficient magnitude to set said Josephson junction device in said first storage loop of said memory cell into a superconducting state, and the removal of said currents leaves said storage loop in a non-circulating current state.

6. A high density Josephson junction memory circuit as set forth in claim 1 wherein said plurality of said memory cells on said substrate are arranged in a column,
said biasing gate current source being connected to the upper most memory cell in said column and said low reference voltage source of said upper most memory cell being connected to the biasing gate current source of the next lower memory cell in said column, and
an isolation resistor connected in series between the low reference voltage source of said upper most memory cell and the biasing gate current source of the next lower memory cell.

7. A high density Josephson junction memory circuit as set forth in claim 1 wherein said Josephson junction device in said first branch in said storage loop is mounted on said substrate in a hole in said ground plane.

8. A high density Josephson junction memory circuit as set forth in claim 1 wherein said Josephson junction device in said first branch of said storage loop is mounted on top of an insulating dielectric pad on said substrate located in a hole in said ground plane.

9. A high density Josephson junction memory circuit as set forth in claim 1 wherein said first branch and said second branch of said storage loop of said memory cells each contain an inductive reactance in the respective branches.

10. A high density Josephson junction memory circuit as set forth in claim 9 wherein said Josephson junction device in said first branch of said storage loop comprises a coupling inductive reactance in series with said Josephson junction device and said X current control line and said Y current control line are inductively coupled to said coupling inductive reactance.

11. A high density Josephson junction memory circuit as set forth in claim 10 wherein said coupling inductive reactance is smaller than said first branch inductive reactance and said second branch inductive reactance.

12. A high density Josephson junction memory circuit as set forth in claim 1 wherein said Josephson junction device in said first branch of said storage loop comprises a tunnel barrier junction located between a counter electrode and a base electrode and said tunnel barrier junction exhibits properties of parallel capacitance C and parallel resistance, and said Josephson junction device also exhibits properties of a series coupling inductive reactance, and
a damping resistor connected in parallel across said Josephson junction device and said parallel capacitance and said parallel resistance.

13. A high density Josephson junction memory circuit as set forth in claim 12 wherein said damping resistance $R_d$ is equal to the square root of LC divided by 1.6 where L is the inductive reactance of said storage loop and C is the equivalent parallel capacitance of said Josephson junction device.

14. A high density Josephson junction memory circuit comprising:
a substrate,
a ground plane pattern on said substrate,
said ground plane pattern comprising a plurality of holes arranged in columns and rows,
dielectric insulator pads deposited in said holes of said ground plane pattern to form a planar surface,
a plurality of memory cells mounted on said planar surface,
each said memory cell comprising a storage loop having a biasing gate current source, a low reference voltage source and a storage loop connected between said current source and said voltage source,
said storage loop having a first branch and a second branch connected in parallel,
a single Josephson junction device in said first branch,
said Josephson junction device being located on a dielectric insulator pad,
an inductive reactance in said first branch and an inductive reactance in said second branch of equal magnitude,
an X current control line inductively coupled to each said Josephson junction device,
a Y current control line inductively coupled to each said Josephson junction device,
said coupling between said X and said Y control lines and each said Josephson junction device being separated from said ground plane pattern so that the threshold characteristic of said Josephson junction device is symmetrical with respect to said biasing gate current, and
sensing means inductively coupled to said second branch of said storage loop for sensing the magnitude of the current flowing in said loop of said memory cell.

* * * * *